(12) United States Patent
Gabler et al.

(10) Patent No.: US 9,780,061 B2
(45) Date of Patent: Oct. 3, 2017

(54) MOLDED CHIP PACKAGE AND METHOD OF MANUFACTURING THE SAME

(71) Applicant: Infineon Technologies AG, Neubiberg (DE)

(72) Inventors: Franz Gabler, Lappersdorf (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/287,080

(22) Filed: May 26, 2014

(65) Prior Publication Data

US 2015/0340307 A1 Nov. 26, 2015

(51) Int. Cl.
| | |
|---|---|
| *H01L 23/495* | (2006.01) |
| *H01L 23/538* | (2006.01) |
| *H01L 23/00* | (2006.01) |
| *H01L 23/31* | (2006.01) |
| *H01L 21/78* | (2006.01) |
| *H01L 23/29* | (2006.01) |
| *H01L 21/56* | (2006.01) |

(52) U.S. Cl.
CPC .............. *H01L 24/48* (2013.01); *H01L 21/56* (2013.01); *H01L 21/78* (2013.01); *H01L 23/29* (2013.01); *H01L 23/3114* (2013.01); *H01L 23/3135* (2013.01); *H01L 23/49524* (2013.01); *H01L 23/49575* (2013.01); *H01L 23/49586* (2013.01); *H01L 23/5389* (2013.01); *H01L 24/02* (2013.01); *H01L 24/18* (2013.01); *H01L 24/96* (2013.01); *H01L 24/97* (2013.01); *H01L 21/561* (2013.01); *H01L 21/568* (2013.01); *H01L 23/3107* (2013.01); *H01L 2224/02373* (2013.01); *H01L 2224/04105* (2013.01); *H01L 2224/06181* (2013.01); *H01L 2224/18* (2013.01); *H01L 2224/2518* (2013.01); *H01L 2224/32245* (2013.01); *H01L 2224/40245* (2013.01); *H01L 2224/48247* (2013.01); *H01L 2224/48472* (2013.01); *H01L 2224/73263* (2013.01); *H01L 2224/73265* (2013.01); *H01L 2224/8392* (2013.01); *H01L 2224/8592* (2013.01); *H01L 2924/00014* (2013.01); *H01L 2924/13055* (2013.01); *H01L 2924/13091* (2013.01); *H01L 2924/181* (2013.01)

(58) Field of Classification Search
CPC ............... H01L 23/49586; H01L 24/02; H01L 23/3114; H01L 21/78; H01L 23/49575; H01L 23/29; H01L 2224/02373; H01L 29/40; H01L 23/3135; H01L 23/3733
See application file for complete search history.

(56) References Cited

U.S. PATENT DOCUMENTS

| | | | | |
|---|---|---|---|---|
| 5,585,040 A | * | 12/1996 | Kirmanen et al. | ........ 252/519.33 |
| 6,013,109 A | * | 1/2000 | Choi | .................... H01L 23/3135 |
| | | | | 257/E23.126 |
| 7,632,587 B2 | * | 12/2009 | McLean et al. | ............... 429/453 |

(Continued)

*Primary Examiner* — Daniel Luke
*Assistant Examiner* — Khatib Rahman

(57) ABSTRACT

A method of manufacturing a molded chip package is provided which comprises arranging an electronic chip on a supporting structure; forming an isolation layer at least on portions of the electronic chip; and molding an encapsulation which covers the electronic chip and the supporting structure at least partially by using a molding material comprising a matrix material and a conductive filler material.

20 Claims, 4 Drawing Sheets

(56) References Cited

U.S. PATENT DOCUMENTS

| | | | |
|---|---|---|---|
| 2006/0256529 A1* | 11/2006 | Liu et al. ....................... | 361/704 |
| 2007/0012900 A1* | 1/2007 | Callen et al. ................. | 252/500 |
| 2008/0265386 A1* | 10/2008 | Muto ....................... | H01L 24/84 |
| | | | 257/676 |
| 2009/0026560 A1* | 1/2009 | Wombacher et al. ........ | 257/415 |
| 2012/0061861 A1* | 3/2012 | Wada ............................ | 257/793 |
| 2013/0221493 A1* | 8/2013 | Kim ....................... | H01L 23/481 |
| | | | 257/620 |
| 2013/0295720 A1* | 11/2013 | Fuergut et al. ............... | 438/107 |
| 2014/0061878 A1 | 3/2014 | Mahler et al. | |

* cited by examiner

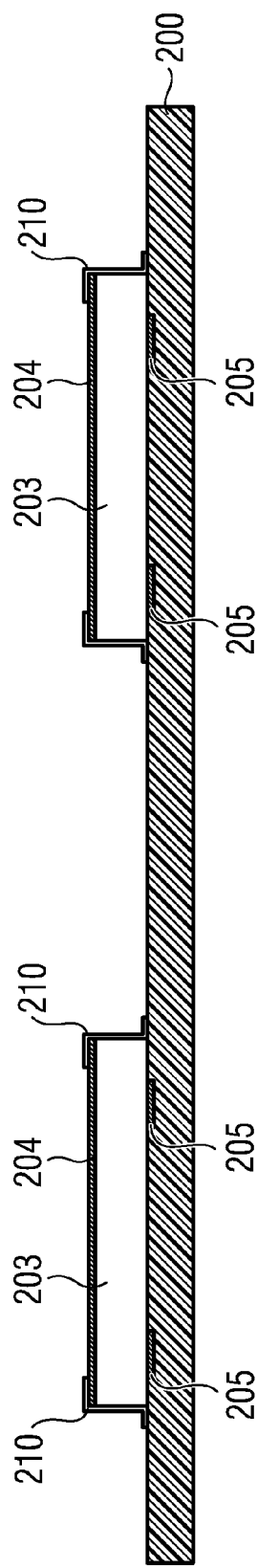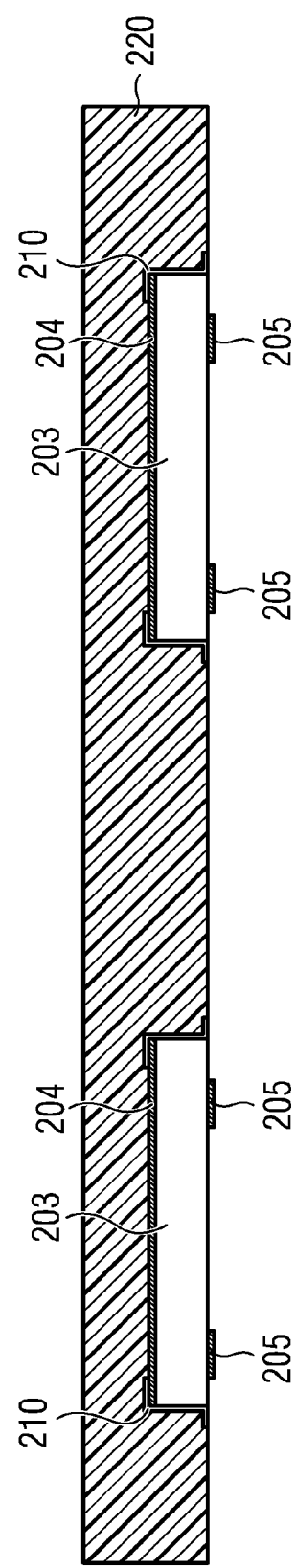

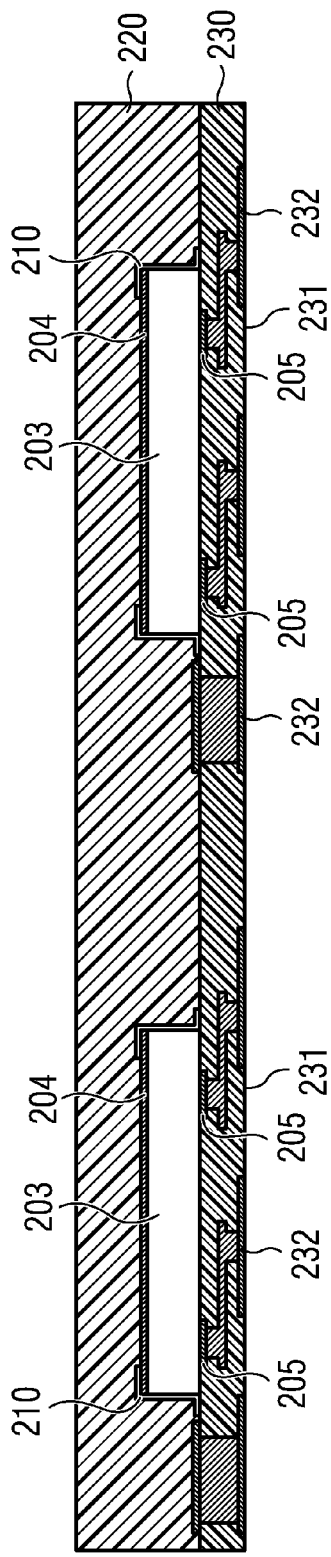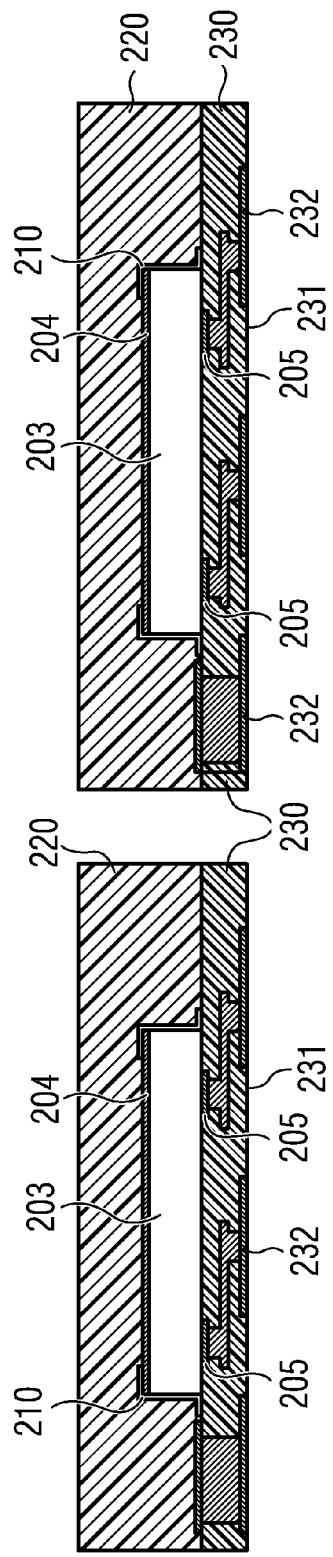

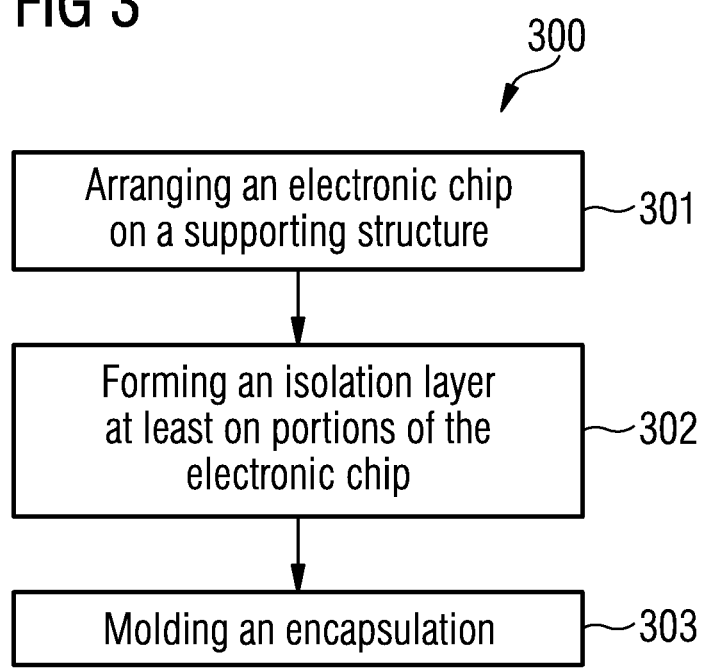

MOLDED CHIP PACKAGE AND METHOD OF MANUFACTURING THE SAME

TECHNICAL FIELD

Various embodiments relate to a molded chip package and a method of manufacturing a molded chip package.

BACKGROUND

Housed integrated circuits are well known in the prior art. For example€, from US 2014/0061878 A1 an integrated circuit is known, which is encapsulated by an adhesive material wherein the adhesive material is applied to the chip back side by pressure, dispensing, printing or spin coating. This adhesive material applied to the back side is then also used for adhering a carrier to the chip back side.

Furthermore, in many technical fields molded chip packages, e.g. so called molded power packages, are used for providing or switching power to electrical components or devices. These molded chip packages comprising a mold material instead of an adhesive material, wherein the molded material is used to form an encapsulation via a molding process. One possible field is the automotive field or uninterruptible power supplies, for example. Most of the molded packages comprise at least one transistor, e.g. an IGBT (insulated gate bipolar transistor) or a MOSFET. Typically the electronic modules are provided in the form of so called packages comprising a housing or an encapsulation.

In particular, in the case of molded power packages, i.e. electronic chips packaged by molding a molding compound around the same, are used for switching or providing a certain amount of power and not only low power (information) signals, the heat produced in the package has to be dissipated from the package. In case of a molded encapsulation the heat dissipation may be limited due to an insulating effect of the encapsulation material.

SUMMARY

Various embodiments provide a molded chip package which comprises an electronic chip arranged on a support structure and comprising a front side and a back side, wherein at least two electronic contacts are formed on the electronic chip, wherein a first one of the at least one electronic contacts is formed on the front side and a second one of the electronic contacts is formed on the back side; a selective isolation layer arranged at least partially on one of the electronic contacts; and a molded encapsulation covering at least the back side of the electronic chip and side walls of the electronic chip, wherein the molded encapsulation comprises a matrix material and a conductive filler material.

Furthermore, various embodiments provide a method of manufacturing a molded chip package, wherein the method comprises arranging an electronic chip on a supporting structure; forming an isolation layer at least on portions of the electronic chip; and molding an encapsulation which covers the electronic chip and the supporting structure at least partially by using a molding material comprising a matrix material and a conductive filler material.

Moreover, various embodiments provide a method of manufacturing a molded chip package, wherein the method comprises providing a leadframe comprising at least one chip reception area; arranging an electronic chip having at least one contact pad on a front side of the electronic chip onto the chip reception area; connecting the at least one contact pad to a portion of the leadframe by an electrically conductive structure; selectively forming an isolation layer on the electrically conductive structure; and molding an encapsulation covering at least the electrically conductive structure by using a molding material comprising a matrix material and a conductive filler material.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIGS. 2A to 2D schematically illustrates a process flow of a method of manufacturing a molded chip package according to a second exemplary embodiment; and FIG. 3 shows a flowchart of a method of manufacturing a molded chip package.

DETAILED DESCRIPTION

Figure 1A:
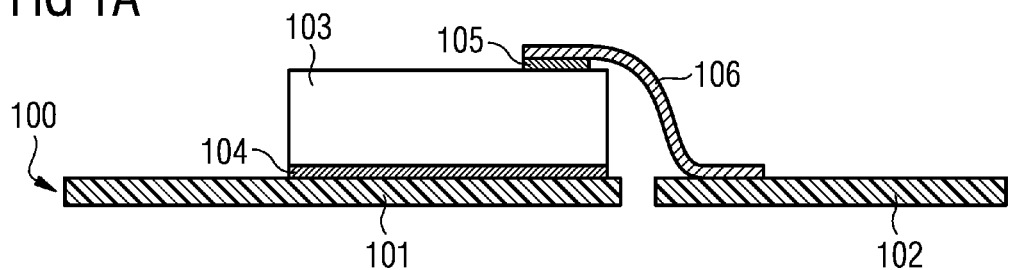
FIGS. 1A to 1C schematically illustrates a process flow of a method of manufacturing a molded chip package according to a first exemplary embodiment.

In the following further exemplary embodiments of an electronic module, an electronic system, and a method of manufacturing an electronic system will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method of manufacturing a molded chip package, wherein a molding process is used to provide an encapsulation for at least one electronic chip arranged on a support structure or support carrier, like a leadframe or a temporary carrier. Furthermore, the electronic chip is electrically connected to an electrically conductive structure, like a bond wire, which is covered by an isolating layer, or to an optional redistribution layer. In particular, during the molding process a molding compound or molding material is used which comprises a matrix material or matric compound in which a high amount of a conductive (electrically and/or thermally conductive) filler material, e.g. metal particles, are included. For example, the molding material may be a non-sticky or non-adhesive material. In particular, the conductive filler material may be formed by particles smoothly dispersed in the matrix material.

In particular, the supporting structure may be a leadframe, a carrier or a temporary carrier, like an embedded wafer layer ball grid array (eWLB) or the like. For example, the encapsulation may be formed on a back side of the electronic chip and may cover the back side of the electronic chip totally. In particular, the back side of the electronic chip comprises at least one electrical contact which is contacted or electrically connected to the encapsulation which may form a ground terminal for the electronic chip and the molded chip package. As well the encapsulation may form a heatsink due to a good thermal conductivity of the molding material including the conductive filler material.

In particular, the conductive filler material may be thermally and/or electrically conductive. For example, the conductive filler material may have a specific electric conductivity of above $10 \cdot 10^6$ S/m and/or a thermal conductivity of above 70 W/mK. It should be noted that the molding of a mold compound or molding material should be distinguished from forming an encapsulation by an adhesive material. In particular, a molding material may be a non-sticky or non-adhesive material, while the adhesive material is a material having adhesive properties. Furthermore, it should be noted that applying an adhesive material is different from molding an package or housing, since applying an adhesive material may only refer to a bonding or adhesive technique, used for example to attach or adhere a further component.

By providing a molded encapsulation comprising a relative high amount or portion of a (thermally and/or electrically) conductive filler material, it may be possible to enable an easy and efficient manufacturing method for providing a good thermal contacting for the electronic chip, e.g. a power transistor or the like and thus improve a heat dissipation for the same. In principle, the molding compound may form a heatsink for the electronic chip or the chip packaged. That is, the package or in more detail the encapsulation or mold compound functions as the heatsink. In case of electronic chips having a vertical current flow (back side contact) the encapsulation may be not only be used for a protecting hull but may also be used for a contacting layer for the back side contact(s) and may form an electrically conducting path for the back contacts. In addition the provision of molded encapsulation including the conductive filler material may be a cost efficient way for providing a semiconductor housing or package having a high heat production.

In the following exemplary embodiments of the molded chip package are described. However, the features and elements described with respect to these embodiments can be combined with exemplary embodiments of the method of manufacturing the molded chip package as well.

According to an exemplary embodiment of the molded chip package the conductive material is a heat conductive material having a coefficient of heat conductivity of more than 70 W/mK.

In particular, the coefficient of heat conductivity may be more than 100 W/mK, more particularly more than 200 W/mK or even more than 300 W/mK. Thus, it may be possible that the overall coefficient of thermal conductivity of the molding material, i.e. including the matrix material, may be high enough in order to enable to use the molded encapsulation as a heatsink.

According to an exemplary embodiment of the molded chip package the conductive material is an electrically conductive material having a specific electric conductivity of higher than $10 \cdot 10^6$ S/m.

In particular, the specific electric conductivity may be higher than $20 \cdot 10^6$ S/m, more particularly higher than $30 \cdot 10^6$ S/m or even higher than $40 \cdot 10^6$ S/m. Thus, it may be possible that the encapsulation may be used for providing an electrical contact, e.g. the ground, as well.

According to an exemplary embodiment the molded chip package further comprises a redistribution layer electrically connected to at least one of the electronic contacts.

By providing a redistribution layer on one or both main sides or main surfaces of the supporting structure or electronic chip it may be possible to provide an efficient way to contact a plurality of electric contacts or terminals of the electronic chip.

According to an exemplary embodiment of the molded chip package the isolation layer comprises as isolating material at least one material selected out of the group consisting of parylene; amide; passivation materials; and oxides.

In general, the isolation layer may comprise or may consist of all materials which are electrically isolating and can be deposited or applied as thin films. In particular, the isolation layer is formed by a chemical vapor deposition process. The forming process may be a selective forming process using a mask. Or the isolation layer may be formed as a continuous layer covering the whole surface and may be patterned or structured subsequently.

According to an exemplary embodiment of the molded chip package the support structure is a lead frame.

According to an exemplary embodiment of the molded chip package the first contact is electrically connected to the lead frame by an electrically conductive structure, wherein the selective insulation is formed on the conductive structure.

In particular, the electrically conductive structure is a conductive interconnect, e.g. a wire, bond wire or clip. For example, the electrically conductive structure may be a bond wire electrically connecting the first contact with a contact area of the leadframe forming.

According to an exemplary embodiment of the molded chip package the isolation layer covers portions of the lead frame.

According to an exemplary embodiment of the molded chip package the isolation layer has a thickness of less than 100 micrometer.

In particular, the thickness may be less than 50 micrometer, more particular, between 0.1 micrometer and 50 micrometer, even more particular between 0.1 micrometer and 25 micrometer or even between 0.1 micrometer and 10 micrometer or less than 5 micrometer. By providing such an isolation layer it may be possible to use the molded encapsulation as a heatsink as well as a ground terminal of the molded chip package.

According to an exemplary embodiment the molded chip package comprises a plurality of electronic chips.

In the following exemplary embodiments of the method of manufacturing a molded chip package are described. However, the features and elements described with respect to these embodiments can be combined with exemplary embodiments of the molded chip package as well.

According to an exemplary embodiment of the method a plurality of electronic chips is arranged on the supporting structure before the encapsulation is molded and the method further comprises singularizing the electronic chips after the encapsulation is molded.

Thus, a plurality of molded chip packages may be formed or manufactured each comprising at least one electronic chip.

According to an exemplary embodiment of the method the molding is performed by one of the processes of the group of processes consisting of: compression molding; transfer molding; and injection molding.

According to an exemplary embodiment of the method the supporting structure is a temporary carrier, wherein the method further comprises removing the supporting structure after molding the encapsulation; and forming a redistribution layer contacting at least one contact of the electronic chip.

In particular, the redistribution layer may be formed, placed or arranged on the front side of the electronic chip. In addition or alternatively a further redistribution layer may be formed on the back side of the chip and/or on the front side of the chip. In particular, the supporting structure may be an embedded wafer ball grid array or the like.

According to an exemplary embodiment of the method the isolation layer has a thickness of less than 15 micrometer.

In particular, the thickness of the isolation layer may be dependent on the voltage level used within the electronic chip and/or the molded chip package. For example, it may be less than 10 micrometer, preferably less than 5 micrometer, or even less than 2.5 micrometer. It should be noted that the isolation layer has to be distinguished from an encapsulation which is typically used for chip packages, since these encapsulations have thicknesses which is much thicker, e.g. in the order of at least hundreds of micrometer or even millimeters.

According to an exemplary embodiment of the method the isolation layer is formed by a chemical vapor deposition process.

In particular, a mask may be used during the forming process for applying the isolation material only selectively. Alternatively, a continuous isolation layer may be formed, e.g. deposited, and then portions or areas of the continuous isolation layer may be selectively removed afterwards.

According to an exemplary embodiment of the method the conductive filler material is formed by metal particles.

In particular, the metal particles may be copper, silver, gold, aluminum, nickel or the like or alloys thereof.

According to an exemplary embodiment of the method the matrix material is a material selected out of the group consisting of: thermoset material; and thermoplast material According to an exemplary embodiment of the method the filler material may constitute between 10 vol % and 95 vol % of the molding material.

In particular, the filler material may amount to between 25 vol % and 90 vol %, more particular between 40 vol % and 90 vol %.

Figure 1B:
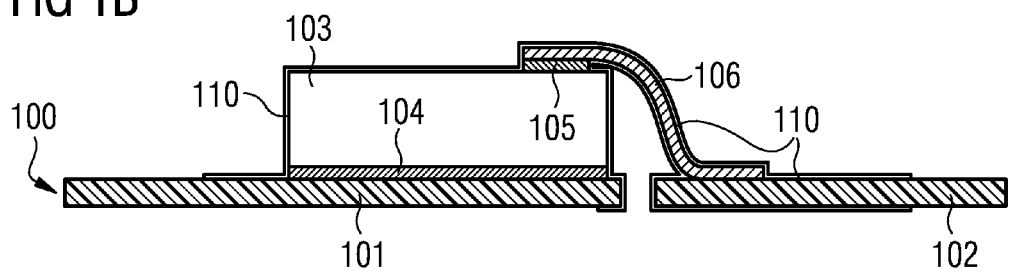
Figure 1C:
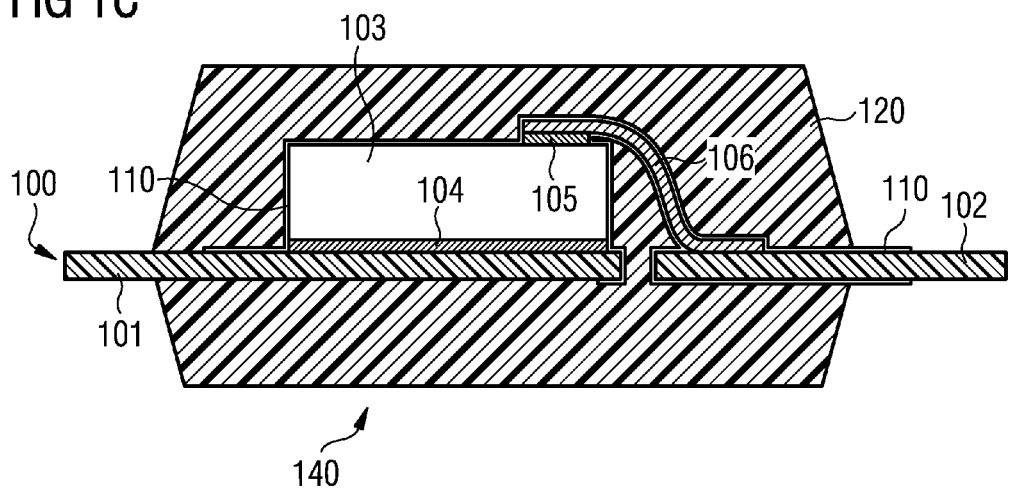

FIGS. 1A to 1C schematically illustrates a process flow of a method of manufacturing a molded chip package according to a first exemplary embodiment.

In particular, FIG. 1A shows a chip carrier 100, e.g. a lead frame or a metal grid, having a chip reception area 101 and a lead portion 102. Onto the chip reception area 101 an electronic chip 103 is attached, e.g. via diebonding by a binding layer (not shown). As shown in FIG. 1A the electronic chip 103 is attached face up to the chip carrier, i.e. the back side of the electronic chip comprising at least one electrical contact 104 is bonded to the chip carrier while the front side of the chip (containing or having contact or signal pads or electrical contacts arranged thereon) form a free side of the electronic chip. For illustrating this, a contact pad 105 is contacted by one end of an electrically conductive structure 106, e.g. a bond wire or clip, which other end is contacted to the lead portion 102 on the other side. Thus, the electrically conductive structure 106 forms an interconnect.

FIG. 1B illustrates a next step of the method of FIG. 1. In particular, an isolation layer 110 is formed over the electronic chip and in particular on the interconnect 106 and on portions of the chip carrier 100. The isolation layer 110 may be formed as a thin coating of less than 10 micrometer for example. In particular, the coating process may be a chemical vapor deposition process using a mask in order to perform a selective coating or isolation process. A suitable material for the coating or isolation layer 110 may be parylene. Alternatively, the isolation layer 110 may be formed as a continuous layer of an isolation material of which some regions or areas may be removed afterwards.

This isolation layer 110 may in particular be useful in case the subsequently molded encapsulation has a relative high conductivity due to the fact that it avoids the forming of shorts.

FIG. 1C illustrates a next step of the method of FIG. 1. In particular, an encapsulation 120 is formed over the electronic chip 103 and the electrically conductive structure 107. The encapsulation is formed by a molding process, like compression molding, transfer molding or injection molding process. For forming the encapsulation a molding material is used comprising a matrix material, e.g. a thermoplast material or thermoset material into which a high amount of conductive (thermally and electrically) material is introduced. The conductive material may thus form a filler material, e.g. metal particles formed by gold, silver, copper or nickel or alloys thereof. After this step in principle the molded chip package 140 is manufactured. Subsequently some electrical contacts may be contacted to the package.

FIGS. 2A to 2D schematically illustrates a process flow of a method of manufacturing a molded chip package according to a second exemplary embodiment.

In particular, FIG. 2A shows a chip carrier 200, e.g. a temporary carrier, like an embedded wafer layer ball grid array, having a two electronic chips 203 attached thereto, e.g. via diebonding. As shown in FIG. 2A the electronic chips 203 are attached face up to the chip carrier or support wafer, i.e. the front side of the electronic chip, comprising electric contacts 205, is bonded to the chip carrier. Electric contact(s) 204 on the back side of the electronic chips, which may be used for grounding, are exposed. Furthermore, an isolation layer 210 is formed over the electronic chips and in particular on portions of the back side of the electronic chips. The isolation layer 210 may be formed as a thin coating of less than 10 micrometer for example. In particular, the coating process may be a chemical vapor deposition process using a mask in order to perform a selective coating or isolation process. A suitable material for the coating or isolation layer 210 may be parylene. Alternatively, the isolation layer 210 may be formed as a continuous layer of an isolation material of which some regions or areas may be removed afterwards. This isolation layer 210 may in particular be useful in case the subsequently molded encapsulation has a relative high conductivity due to the fact that it avoids the forming of shorts.

FIG. 2B illustrates a next step of the method of FIG. 2. In particular, the support wafer or temporary carrier is removed and an encapsulation 220 is formed over the electronic chips 203. The encapsulation is formed by a molding process, like compression molding, transfer molding or injection molding process. For forming the encapsulation a molding material is used comprising a matrix material, e.g. a thermoplast material or thermoset material into which a high amount of conductive (thermally and electrically) material is introduced. The conductive material may thus form a filler material, e.g. metal particles formed by gold, silver, copper or nickel or alloys thereof. It should be noted that the temporary carrier may be removed before or afterwards the encapsulation is formed.

FIG. 2C illustrates a next step of the method of FIG. 2. In particular, a redistribution layer 230, comprising isolating portions 231 and conductor paths 232, is formed or attached to the front side (which is exposed by the removal of the temporary carrier). It should be noted that of course several redistribution layer may be formed.

FIG. 2D illustrates a next step of the method of FIG. 2. In particular, illustrates a singularization step separating the two encapsulated electronic chips 203 from each other. It should be noted that of course more than two electronic chips can be arranged in the temporary carrier. After the singularization step the chip package may be completed by electrically contacting the back side through the mold compound or encapsulation.

FIG. 3 shows a flowchart of a method 300 of manufacturing a molded chip package. In particular, the method 300 of manufacturing a molded chip package comprises arranging an electronic chip on a supporting structure (step 301), which may be a temporary carrier (like an eWLB) or a leadframe, for example. Subsequently, an isolation layer is formed at least on portions of the electronic chip, e.g. on electric contact(s), electrically conductive structures, the electronic chip and/or portions of the supporting structure (step 302). Then an encapsulation is molded which covers the electronic chip and the supporting structure at least partially by using a molding material comprising a matrix material and a conductive filler material (step 303).

Summarizing exemplary embodiments may provide a molded chip package and a method of manufacturing the same having a good thermal connection of the respective electronic chip like a transistor to the molded encapsulation or package. In order to enable that the molded encapsulation may be used not only as a cover or protection layer but also for providing an electrically back side contacting an additional isolation layer may be selectively formed on the electronic chip and/or chip carrier. This isolation layer may be formed by a common deposition process, like chemical vapor deposition and may be selective in that sense that specific electric contact(s) or contact pads on the front side and/or back side of the electronic chip are not covered by the isolation layer.

Thus, the electric contact(s) (preferably on the back side of the chip, forming drain(s) of a transistor(s), for example) will then come into electrical and thermal contact with the encapsulation which is a molded compound comprising a matrix material and a filler material having a high thermal and/or electrical conductivity, and formed by metal particles, for example.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A molded chip package, comprising:
    an electronic chip arranged on a support structure and comprising a front side and a back side, wherein at least two electronic contacts are formed on the electronic chip, wherein a first one of the at least one electronic contacts is formed on the front side and a second one of the electronic contacts is formed on the back side;
    a selective isolation layer arranged on one of the electronic contacts such that the electronic contact on the back side is only partially covered by the selective isolation layer;
    wherein the selective isolation layer is formed on portions of the support structure,
    wherein the selective isolation layer is formed on side walls of the electronic chip between the front side and the back side, and
    a molded encapsulation covering at least the back side of the electronic chip together with the second one of the electronic contacts and side walls of the electronic chip, wherein the molded encapsulation comprises a matrix material and a conductive filler material, such that the encapsulation is useable as a contacting layer for the electronic contact on the back side for forming an electrically conducting path for the contact on the back side.

2. The molded chip package according to claim 1, wherein the conductive filler material is a heat conductive material having a coefficient of heat conductivity of more than 70 W/mK.

3. The molded chip package according to claim 1, wherein the conductive filler material is an electrically conductive material having a specific electric conductivity of more than $10 10^6$ S/m.

4. The molded chip package according to claim 1, further comprising a redistribution layer electrically connected to at least one of the electronic contacts.

5. The molded chip package according to claim 1, wherein the isolation layer comprises as isolating material at least one material selected out of the group consisting of:
    parylene;
    amide;
    passivation materials; and
    oxides.

6. The molded chip package according to claim 1, wherein the support structure is a lead frame.

7. The molded chip package according to claim 6, wherein the first contact is electrically connected to the lead frame by an electrically conductive structure, wherein the selective insulation is formed on the electrically conductive structure.

8. The molded chip package according to claim 6, wherein the isolation layer covers portions of the lead frame.

9. The molded chip package according to claim 1, wherein the isolation layer has a thickness of less than 100 micrometer.

10. The molded chip package according to claim 1, comprising a plurality of electronic chips.

11. A method of manufacturing a molded chip package, the method comprising:
    arranging an electronic chip on a support structure, comprising a front side and a back side, wherein at least two electronic contacts are formed on the electronic chip, wherein a first one of the at least one electronic contacts is formed on the front side and a second one of the electronic contacts is formed on the back side;
    forming an isolation layer at least on portions of the electronic chip;
    arranging the isolation layer on one of the electronic contacts such that the electronic contact on the back side is only partially covered by the isolation layer;
    forming the isolation layer on portions of the support structure,
    forming the isolation layer on side walls of the electronic chip between the front side and the back side; and
    molding an encapsulation which covers at least the back side of the electronic chip together with the second one of the electronic contacts and side walls of the electronic chip and the support structure at least partially by using a molding material comprising a matrix material and a conductive filler material, such that the encapsulation is useable as a contacting layer for the electronic contact on the back side for forming an electrically conducting path for the contact on the back side.

12. The method according to claim 11, wherein a plurality of electronic chips is arranged on the supporting structure before the encapsulation is molded and the method further comprising:
   singulizing the electronic chips after the encapsulation is molded.

13. The method according to claim 11, wherein the molding is performed by one of the processes of the group of processes consisting of:
   compression molding;
   transfer molding; and
   injection molding.

14. The method according to claim 11, wherein the supporting structure is a temporary carrier and wherein the method further comprises:
   removing the supporting structure after molding the encapsulation; and
   forming a redistribution layer contacting at least one contact of the electronic chip.

15. A method of manufacturing a molded chip package, the method comprising:
   providing a leadframe comprising at least one chip reception area;
   arranging an electronic chip having at least one contact pad on a front side of the electronic chip onto the chip reception area, and comprising a back side, wherein at least one electronic contact is formed on the back side;
   connecting the at least one contact pad to a portion of the leadframe by an electrically conductive structure;
   selectively forming an isolation layer on the electrically conductive structure;
   arranging the isolation layer on one of the electronic contacts such that the electronic contact on the back side is only partially covered by the isolation layer;
   forming the isolation layer on portions of the leadframe,
   forming the isolation layer on side walls of the electronic chip between the front side and the back side; and
   molding an encapsulation covering at least the electrically conductive structure and covering at least the back side of the electronic chip together with a second one of the electronic contacts and side walls of the electronic chip by using a molding material comprising a matrix material and a conductive filler material, such that the encapsulation is useable as a contacting layer for the electronic contact on the back side for forming an electrically conducting path for the contact on the back side.

16. The method according to claim 15, wherein the isolation layer has a thickness of less than 15 micrometer.

17. The method according to claim 15, wherein the isolation layer is formed by a chemical vapor deposition process.

18. The method according to claim 15, wherein the conductive filler material is formed by metal particles.

19. The method according to claim 15, wherein the matrix material is a material selected out of the group consisting of:
   thermoset material;
   thermoplast material.

20. The method according to claim 16, wherein the filler material may constitute between 10 vol % and 95 vol % of the molding material.

* * * * *